US008843693B2

(12) United States Patent
Hsu et al.

(10) Patent No.: US 8,843,693 B2
(45) Date of Patent: Sep. 23, 2014

(54) NON-VOLATILE MEMORY AND METHOD WITH IMPROVED DATA SCRAMBLING

(75) Inventors: Jonathan Hsu, Newark, CA (US); Chris Nga Yee Avila, Milpitas, CA (US); Alexander Kwok-Tung Mak, Los Altos Hills, CA (US); Sergey Anatolievich Gorobets, Edinburgh (GB); Tien-chien Kuo, Sunnyvale, CA (US); Yee Lih Koh, Milpitas, CA (US); Jun Wan, Milpitas, CA (US)

(73) Assignee: Sandisk Technologies, Inc., Plano, TX (US)

( * ) Notice: Subject to any disclaimer, the term of this patent is extended or adjusted under 35 U.S.C. 154(b) by 438 days.

(21) Appl. No.: 13/109,972

(22) Filed: May 17, 2011

(65) Prior Publication Data

US 2012/0297111 A1    Nov. 22, 2012

(51) Int. Cl.
G06F 12/00  (2006.01)
G11C 7/10  (2006.01)
G11C 16/34  (2006.01)
G06F 12/14  (2006.01)

(52) U.S. Cl.
CPC ........ *G11C 16/3427* (2013.01); *G06F 12/1408* (2013.01); *G11C 7/1012* (2013.01); *G11C 7/1006* (2013.01)
USPC .......................................... 711/103; 711/163

(58) Field of Classification Search
USPC .................... 711/103, 163; 713/193
See application file for complete search history.

(56) References Cited

U.S. PATENT DOCUMENTS

| 4,357,685 | A | 11/1982 | Daniele et al. |
|---|---|---|---|
| 4,993,029 | A | 2/1991 | Galbraith et al. |
| 5,070,032 | A | 12/1991 | Yuan et al. |

(Continued)

FOREIGN PATENT DOCUMENTS

| EP | 1 130 600 A | 9/2001 |
|---|---|---|
| EP | 1 684 308 A | 7/2006 |

(Continued)

OTHER PUBLICATIONS

Notification of Transmittal of the International Search Report and the Written Opinion of the International Searching Authority, or the Declaration for International Application No. PCT/US2012/036015 mailed Sep. 4, 2012, 10 pages.

(Continued)

*Primary Examiner* — Aimee Li
*Assistant Examiner* — Christopher Do
(74) *Attorney, Agent, or Firm* — Davis Wright Tremaine LLP

(57) ABSTRACT

A memory device cooperating with a memory controller scrambles each unit of data using a selected scrambling key before storing it in an array of nonvolatile memory cells. This helps to reduce program disturbs, user read disturbs, and floating gate to floating gate coupling that result from repeated and long term storage of specific data patterns. For a given page of data having a logical address and for storing at a physical address, the key is selected from a finite sequence thereof as a function of both the logical address and the physical address. In a block management scheme the memory array is organized into erase blocks, the physical address is the relative page number in each block. When logical address are grouped into logical groups and manipulated as a group and each group is storable into a sub-block, the physical address is the relative page number in the sub-block.

20 Claims, 12 Drawing Sheets

(56) References Cited

U.S. PATENT DOCUMENTS

| | | | |
|---|---|---|---|
| 5,095,344 | A | 3/1992 | Harari |
| 5,172,338 | A | 12/1992 | Mehrotra et al. |
| 5,313,421 | A | 5/1994 | Guterman et al. |
| 5,315,541 | A | 5/1994 | Harari et al. |
| 5,343,063 | A | 8/1994 | Yuan et al. |
| 5,418,752 | A | 5/1995 | Harari et al. |
| 5,570,315 | A | 10/1996 | Tanaka et al. |
| 5,595,924 | A | 1/1997 | Yuan et al. |
| 5,661,053 | A | 8/1997 | Yuan |
| 5,768,192 | A | 6/1998 | Eitan |
| 5,774,397 | A | 6/1998 | Endoh et al. |
| 5,903,495 | A | 5/1999 | Takeuchi et al. |
| 5,912,854 | A | 6/1999 | Vogley et al. |
| 5,996,041 | A | 11/1999 | Kim |
| 6,011,725 | A | 1/2000 | Eitan |
| 6,046,935 | A | 4/2000 | Takeuchi et al. |
| 6,222,762 | B1 | 4/2001 | Guterman et al. |
| 6,266,273 | B1 | 7/2001 | Conley et al. |
| 6,657,891 | B1 | 12/2003 | Shibata et al. |
| 6,870,768 | B2 | 3/2005 | Cernea et al. |
| 6,983,428 | B2 | 1/2006 | Cernea |
| 7,006,379 | B2 | 2/2006 | Noguchi et al. |
| 7,023,736 | B2 | 4/2006 | Cernea et al. |
| 7,073,103 | B2 | 7/2006 | Gongwer et al. |
| 7,120,051 | B2 | 10/2006 | Gorobets et al. |
| 7,230,851 | B2 | 6/2007 | Fong et al. |
| 7,237,074 | B2 | 6/2007 | Guterman et al. |
| 7,251,160 | B2 | 7/2007 | Li et al. |
| 7,489,547 | B2 | 2/2009 | Moogat et al. |
| 7,549,011 | B2 | 6/2009 | Moschopoulos |
| 7,558,131 | B2 | 7/2009 | Han |
| 7,606,966 | B2 | 10/2009 | Li et al. |
| 7,734,861 | B2 | 6/2010 | Li et al. |
| 7,818,525 | B1 | 10/2010 | Frost et al. |
| 7,885,112 | B2 | 2/2011 | Li et al. |
| 8,130,550 | B1 * | 3/2012 | Confalonieri ............ 365/185.11 |
| 2002/0108045 | A1 | 8/2002 | Wells |
| 2004/0160829 | A1 | 8/2004 | Tsujikawa et al. |
| 2004/0228197 | A1 | 11/2004 | Mokhlesi |
| 2005/0195635 | A1 | 9/2005 | Conley et al. |
| 2005/0257120 | A1 | 11/2005 | Gorobets et al. |
| 2006/0002190 | A1 | 1/2006 | Roohparvar |
| 2006/0031593 | A1 | 2/2006 | Sinclair |
| 2006/0062055 | A1 | 3/2006 | Sekiguchi et al. |
| 2006/0126390 | A1 | 6/2006 | Gorobets et al. |
| 2006/0136687 | A1 | 6/2006 | Conley et al. |
| 2006/0140007 | A1 | 6/2006 | Cernea et al. |
| 2006/0198195 | A1 | 9/2006 | Hemink et al. |
| 2006/0221696 | A1 | 10/2006 | Li |
| 2006/0233022 | A1 | 10/2006 | Li |
| 2006/0233023 | A1 | 10/2006 | Lin et al. |
| 2006/0233026 | A1 | 10/2006 | Li |
| 2007/0097744 | A1 | 5/2007 | Li et al. |
| 2007/0261118 | A1 | 11/2007 | Lu |
| 2008/0263369 | A1 * | 10/2008 | Min et al. ............ 713/193 |
| 2009/0204824 | A1 * | 8/2009 | Lin et al. ............ 713/193 |
| 2009/0316490 | A1 | 12/2009 | Takada |
| 2009/0323942 | A1 | 12/2009 | Sharon et al. |
| 2010/0172180 | A1 | 7/2010 | Paley et al. |

FOREIGN PATENT DOCUMENTS

| | | |
|---|---|---|
| JP | 07-240098 A | 9/1995 |
| JP | 2006-228407 A | 8/2006 |
| TW | I244089 B | 11/2005 |
| WO | WO 2006/107651 A1 | 10/2006 |
| WO | WO 2008/031074 A1 | 3/2008 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

Van de Goor et al., "Address and Data Scrambling: Causes and Impact on Memory Tests." Proceedings of the First IEEE International Workshop on Electronic Design, Test and Applications (DELTA'02), 2002, 9 pages.

* cited by examiner

| Physical PageOffsetAddr in a block | LogicalAddr | $K_i=K_i(\text{LogicalAddr mod L})$ L=32 |
|---|---|---|
| 0 | 32 | 0 |
| 1 | 100 | 4 |
| 2 | 1000 | 8 |
| 3 | 1 | 1 |

| Physical PageOffsetAddr in a block | LogicalAddr | $K_i=K_i(\text{LogicalAddr mod L})$ L=32 |
|---|---|---|
| 0 | 32 | 0 |
| 1 | 32 | 0 |
| 2 | 32 | 0 |
| 3 | 32 | 0 |

| Physical PageOffsetAddr in a block | LogicalAddr | Sub-Block | K= (PageOffsetAddr mod N) (N=4) |
|---|---|---|---|
| 0 | 32 | 1 | 0 |
| 1 | 32 | 1 | 1 |
| 2 | 32 | 1 | 2 |
| 3 | 32 | 1 | 3 |
| 4 | 32 | 2 | 0 |
| 5 | 32 | 2 | 1 |
| 6 | 32 | 2 | 2 |
| ... | ... | ... | ... |

*FIG. 11*

| Physical PageOffsetAddr in a block | LogicalAddr | Sub-Block | K= [(LogicalAddr mod L) + (PageOffsetAddr mod N)] mod L (L=32, N=4) |
|---|---|---|---|
| 0 | 100 | 1 | 4 |
| 1 | 1000 | 1 | 9 |
| 2 | 2010 | 1 | 28 |
| 3 | 2011 | 1 | 30 |
| 4 | 32 | 2 | 0 |
| 5 | 32 | 2 | 1 |
| 6 | 32 | 2 | 2 |
| ... | ... | ... | ... |

*FIG. 12*

| WL | Lower | Upper |
|----|-------|-------|
| 0  | 69    | AB    |
| 1  | D7    | D2    |
| 2  | /69   | /AB   |
| 3  | /D7   | /D2   |
| 4  | 69    | AB    |
| 5  | D7    | D2    |
| 6  | /69   | /AB   |
| 7  | /D7   | /D2   |
| 8  | 69    | AB    |
| 9  | D7    | D2    |

Psuedo Random Data Invertion

*FIG. 13*

| WL | Lower | Upper |
|---|---|---|
| 0 | 69 | AB |
| 1 | D7 | D2 |
| 2 | 69 | AB |
| 3 | D7 | /D2 |
| 4 | 69 | AB |
| 5 | D7 | D2 |
| 6 | 69 | /AB |
| 7 | D7 | /D2 |
| 8 | 69 | AB |
| 9 | D7 | /D2 |
| 10 | 69 | /AB |
| 11 | D7 | D2 |

| WL | Lower | Upper |
|---|---|---|
| 12 | /69 | AB |
| 13 | D7 | /D2 |
| 14 | /69 | /AB |
| 15 | D7 | /D2 |
| 16 | 69 | AB |
| 17 | /D7 | D2 |
| 18 | /69 | /AB |
| 19 | /D7 | /D2 |
| 20 | 69 | /AB |
| 21 | D7 | D2 |
| 22 | /69 | /AB |
| 23 | /D7 | /D2 |

| WL | Lower | Upper |
|---|---|---|
| 24 | 69 | AB |
| 25 | /D7 | /D2 |
| 26 | /69 | /AB |
| 27 | /D7 | D2 |
| 28 | /69 | /AB |
| 29 | D7 | D2 |
| 30 | 69 | /AB |
| 31 | D7 | /D2 |

FIG. 14

| Physical PageOffsetAddr | Logical Addr | K=k(LogicalAddr mod L) L=32 | Data Inversion |
|---|---|---|---|
| 0 | 100 | 4 | No |
| 1 | 1000 | 9 | No |
| 2 | 2010 | 28 | No |
| 3 | 2011 | 30 | No |
| 4 | 32 | 0 | Yes |
| 5 | 32 | 1 | No |
| 6 | 32 | 2 | Yes |
| 7 | 32 | 2 | Yes |

*FIG. 15*

NON-VOLATILE MEMORY AND METHOD WITH IMPROVED DATA SCRAMBLING

FIELD OF THE INVENTION

This application relates to the operation of re-programmable non-volatile memory systems such as semiconductor flash memory, and, more specifically, to efficient scrambling of data in order to avoid occurrence of regular pattern of data stored in a memory array that may exacerbate disturbance between cells.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

It is common in current commercial products for each storage element of a flash EEPROM array to store a single bit of data by operating in a binary mode, where two ranges of threshold levels of the storage element transistors are defined as storage levels. The threshold levels of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold levels as storage states for each storage element transistor, four such states (2 bits of data per storage element) now being included in commercial products. More storage states, such as 16 states per storage element, are also being implemented. Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

NAND Memory and Program Disturb

NAND memory is prone to data dependency related program disturb. Program disturb happens when programming of the target word line unintentionally program adjacent word lines, resulting in potential data corruption. Data dependency can make program disturb problem worse, and one of the problematic pattern could be repeating of the same data for the NAND chain.

U.S. Pat. No. 7,885,112 discloses on-chip randomization schemes in non-volatile memory, based on page offset address in a block.

There is still a general need for more flexible schemes to scramble data stored in a nonvolatile memory to help avoid problematic data pattern that will exacerbate program disturb problems.

SUMMARY AND OBJECTS OF THE INVENTION

According to a general aspect of the invention, a memory device cooperating with a memory controller scrambles each unit of data using a selected scrambling key before storing it in an array of nonvolatile memory cells. For a given page of data having a logical address and for storing at a physical address, the key is selected from a finite sequence thereof as a function of both the logical address and a localized physical address.

In particular, where the memory has a block management scheme, the memory array is organized into erase blocks, and when logical address are grouped into logical groups and manipulated as a group and each group is storable into a sub-block, the physical address is the relative page number in the sub-block. In this way, when a logical group is relocated to another memory location, the copying is done on the group boundary (i.e., sub-block by sub-block). The logical group can be copied to the new location in its scrambled state. When reading back the logical group at the new location, the same scrambling key can be used to perform the unscrambling because, the logical address of each page in the group has not changed, nor has its localized physical address. Relocation of data from one physical location to another in a memory array is a common internal memory operation such as for garbage collection and for caching in single-level memory (SLC) before folding to multi-level memory (MLC).

The physical address is a localized one that aligns with the boundary of a logical group of pages that is expected to be relocated to any portion of the memory as a unit. In a specific embodiment, the finite sequence of keys is of length L and the localized physical addresses have a length N, and the sequence number of the selected key is given by [(logical address) mod L+(physical address) mod N] mod L.

In another embodiment, the sequence number of the selected key is further randomized by selectively inverting predetermined physical addresses.

Scrambling of data before storing in the memory array helps to reduce program disturbs, user read disturbs, and floating gate to floating gate coupling that result from repeated and long term storage of specific data patterns. The present invention is a computational and memory efficient scheme to achieve data scrambling for a memory. In particular, key selection based on relative physical addresses having a boundaries conforming to logical groups defined by a block management system allows individual logical group to be relocated to another physical locations in the memory array without having to change the key for each data unit in the process since the relative addresses remain the same. Having the key selection depending on both the logical address and the localized physical address overcomes the shortcomings of using only a small set of keys defined by the logical group size.

Additional objects, features and advantages of the present invention will be understood from the following description of its preferred embodiments, which description should be taken in conjunction with the accompanying drawings.

BRIEF DESCRIPTION OF THE DRAWINGS

FIG. 11 illustrates one example of data pattern scrambling with a scrambling key being a function of both the logical address and localized physical address.

FIG. 12 illustrates one example of data pattern scrambling with a scrambling key being a function of both the logical address and localized physical address.

FIG. 13 illustrates an example of inverting being based on the physical address the data every 2 word lines.

FIG. 14 illustrates an example of selectively inverting at the page level.

FIG. 15 illustrates a table similar to that shown in FIG. 12 in which the data is scrambled by a key dependent on both the logical and localized physical addresses.

DESCRIPTION OF THE PREFERRED EMBODIMENTS

Memory System

Figure 1:
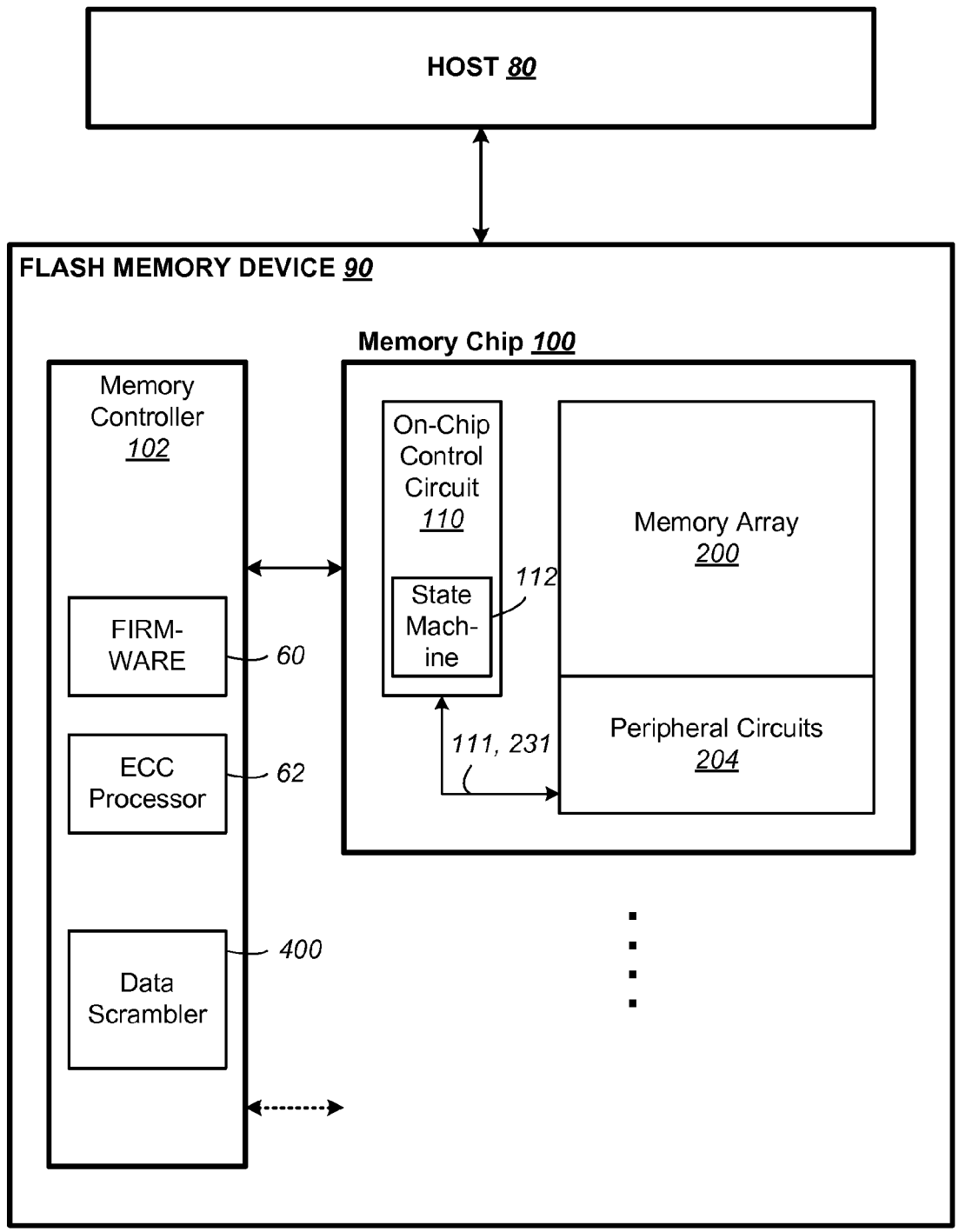
FIG. 1 illustrates a host in communication with a memory device in which the features of the present invention are embodied.

FIG. 1 illustrates a host in communication with a memory device in which the features of the present invention are embodied. The host 80 typically sends data to be stored at the memory device 90 or retrieves data by reading the memory device 90. The memory device 90 includes one or more memory chip 100 managed by a memory controller 102. The memory chip 100 includes a memory array 200 of memory cells with each cell capable of being configured as a multi-level cell ("MLC") for storing multiple bits of data, as well as capable of being configured as a single-level cell ("SLC") for storing 1 bit of data. The memory chip also includes peripheral circuits 204 such as row and column decoders, sense modules, data latches and I/O circuits. An on-chip control circuitry 110 controls low-level memory operations of each chip. The control circuitry 110 is an on-chip controller that cooperates with the peripheral circuits to perform memory operations on the memory array 200. The control circuitry 110 typically includes a state machine 112 to provide chip level control of memory operations via a data bus 231 and control and address bus 111.

In many implementations, the host 80 communicates and interacts with the memory chip 100 via the memory controller 102. The controller 102 co-operates with the memory chip and controls and manages higher level memory operations. A firmware 60 provides codes to implement the functions of the controller 102. An error correction code ("ECC") processor 62 processes ECC during operations of the memory device.

For example, in a host write, the host 80 sends data to be written to the memory array 200 in logical sectors allocated from a file system of the host's operating system. A memory block management system implemented in the controller stages the sectors and maps and stores them to the physical structure of the memory array. A preferred block management system is disclosed in United States Patent Application Publication Number: US-2010-0172180-A1, the entire disclosure of which is incorporated herein by reference.

Physical Memory Architecture

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

Figure 2:
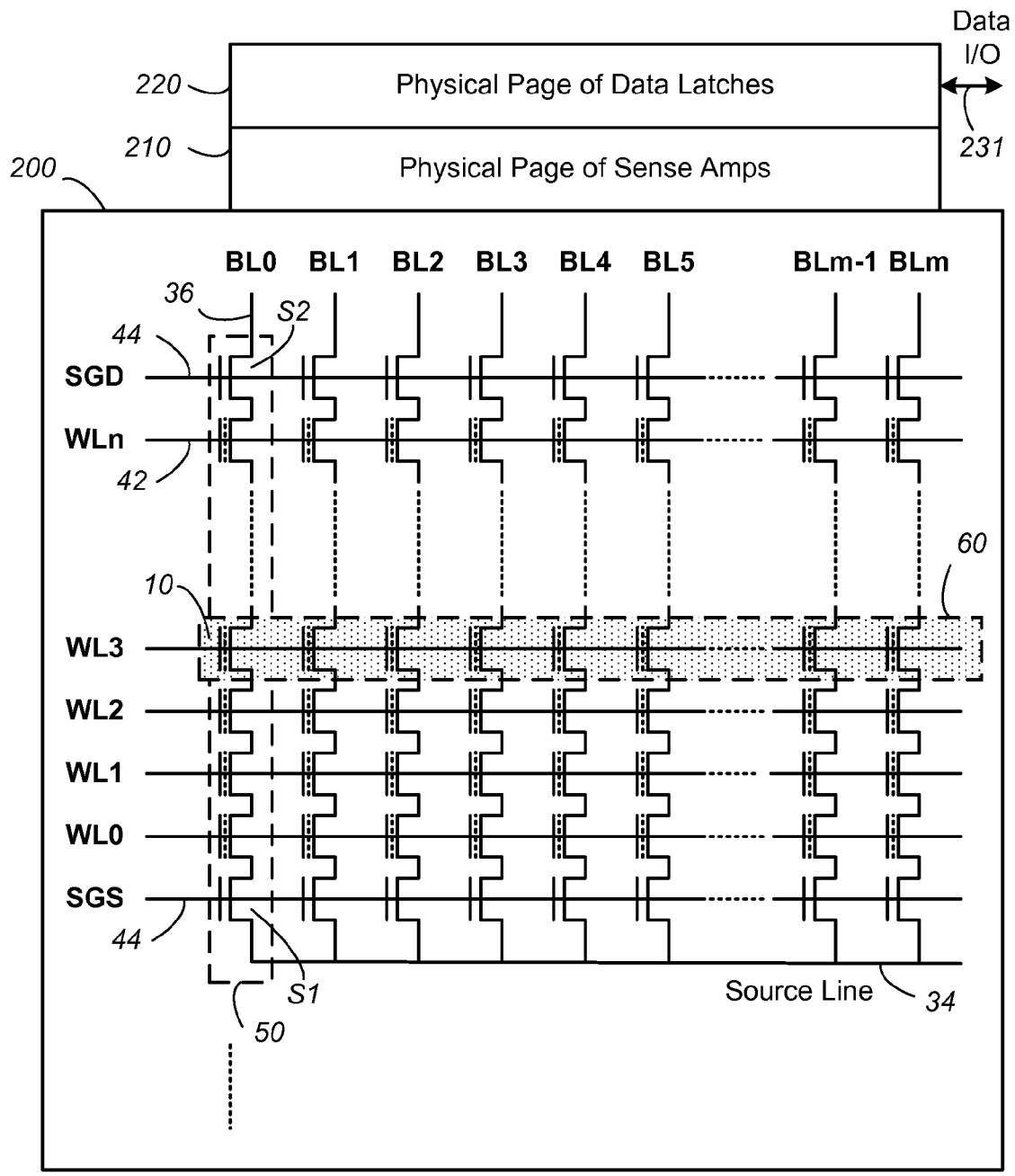
FIG. 2 illustrates a page of memory cells, organized for example in the NAND configuration, being sensed or programmed in parallel.

FIG. 2 illustrates a page of memory cells, organized for example in the NAND configuration, being sensed or programmed in parallel. FIG. 2 essentially shows a bank of NAND strings 50 in the memory array 200 of FIG. 1. A "page" such as the page 60, is a group of memory cells enabled to be sensed or programmed in parallel. This is accomplished in the peripheral circuits by a corresponding page of sense amplifiers 210. The sensed results are latches in a corresponding set of data latches 220. Each sense amplifier can be coupled to a NAND string, such as NAND string 50 via a bit line 36. For example, the page 60 is along a row and is sensed by a sensing voltage applied to the control gates of the cells of the page connected in common to the word line WL3. Along each column, each cell such as cell 10 is accessible by a sense amplifier via a bit line 36. Data in the data latches 220 are toggled in from or out to the memory controller 102 via a data I/O bus 231.

The page referred to above is a physical page memory cells or sense amplifiers. Depending on context, in the case where each cell is storing multi-bit data, each physical page has multiple data pages.

The NAND string 50 is a series of memory transistors 10 daisy-chained by their sources and drains to form a source terminal and a drain terminal respective at its two ends. A pair of select transistors S1, S2 controls the memory transistors chain's connection to the external via the NAND string's source terminal and drain terminal respectively. In a memory array, when the source select transistor S1 is turned on, the source terminal is coupled to a source line 34. Similarly, when the drain select transistor S2 is turned on, the drain terminal of the NAND string is coupled to a bit line 36 of the memory array. Each memory transistor 10 in the chain acts as a memory cell. It has a charge storage element 20 to store a given amount of charge so as to represent an intended memory state. A control gate of each memory transistor allows control over read and write operations. The control gates of corresponding memory transistors of a row of NAND string are all connected to the same word line (such as WL0, WL1, . . . ) Similarly, a control gate of each of the select transistors S1, S2 (accessed via select lines SGS and SGD respectively) provides control access to the NAND string via its source terminal and drain terminal respectively.

Figure 3:
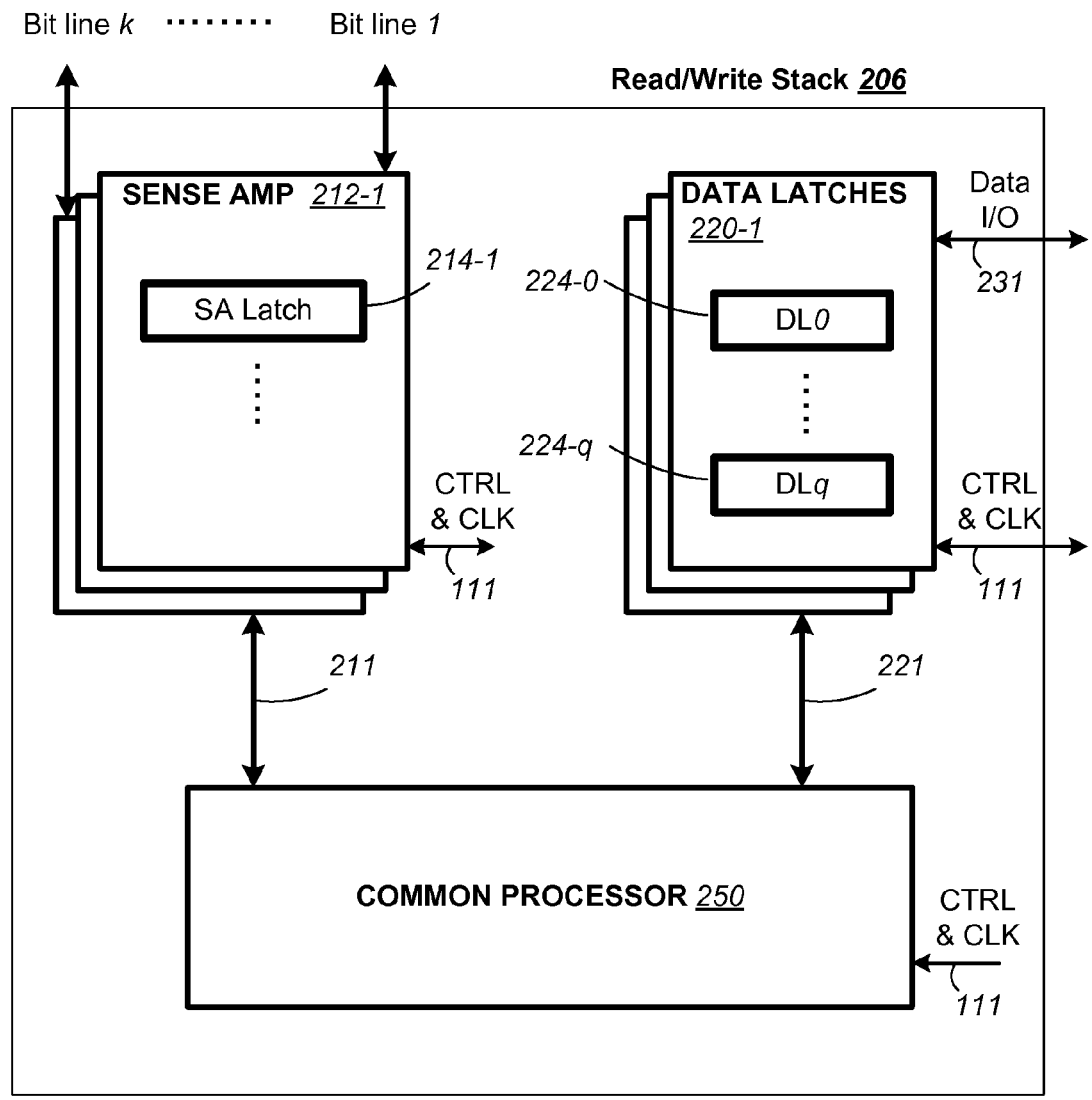
FIG. 3 is a functional block diagram of read/write circuits in the peripheral circuits of FIG. 2.

FIG. 3 is a functional block diagram of read/write circuits in the peripheral circuits of FIG. 2. The read/write circuits 206 include sense amplifiers 212, data latches 230 and a common processor 250. The I/O circuits are coupled to the data latches and not shown explicitly except of a data I/O bus 231. In the embodiment shown, the sense amplifiers and data latches are organized into read/write stacks 206, with each stack serving k memory cells via the bit lines 1 to k, which is a subset of a page in parallel. There are a plurality of such read/write stacks to service the entire pare in parallel. In this way, the number of the common processor 250 for the page is reduced. Each stack 206 contains a stack of sense amplifiers 212-1 to 212-k and a stack of data latches 430-1 to 430-k. The stack of sense amplifiers and the stack of data latches share the common processor 250 which is able to process data among them. The sense amplifiers 212 communicate with the common processor 250 via a bus 211. The data latches 220 communicate with the common processor 250 via a bus 221. At any one time the common processor 250 processes the data related to a given memory cell. For example, for the memory cell coupled to bit line 1, the corresponding sense amplifier 212-1 latches the data sensed from the memory cell into a sense amplifier latch, SA Latch 214-1. Similarly, the corresponding set of data latches 220-1 stores input or output data associated with the memory cell coupled to bit line 1. In the preferred embodiment, the set of data latches 220-1 comprises a set of data latches, 224-0, . . . , 224-q or respectively DL0, DL1, . . . , DLq for storing (q+1)-bits of information. The read/write stack 206 is controlled by the on-chip control circuit via control and address bus 111 and exchange data with the memory controller 102 via the data I/O bus 231 (see also FIG. 1).

The page of memory cells shares a common word line and each memory cell of the page is coupled via bit line to a sense amplifier. When the page of memory cells is read or written, it is also referred to as being read from or written to the word line associated with the page of memory cells. Similarly, the data associated with the page of memory cell is referred to as a page of data.

Such read/write circuits have been described in United States Patent Application Publication US-2006-0140007-A1, published on Jun. 29, 2006, the entire disclosure of which is incorporated herein by reference.

Erase Blocks

One important difference between flash memory and other type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together.

Figure 4:
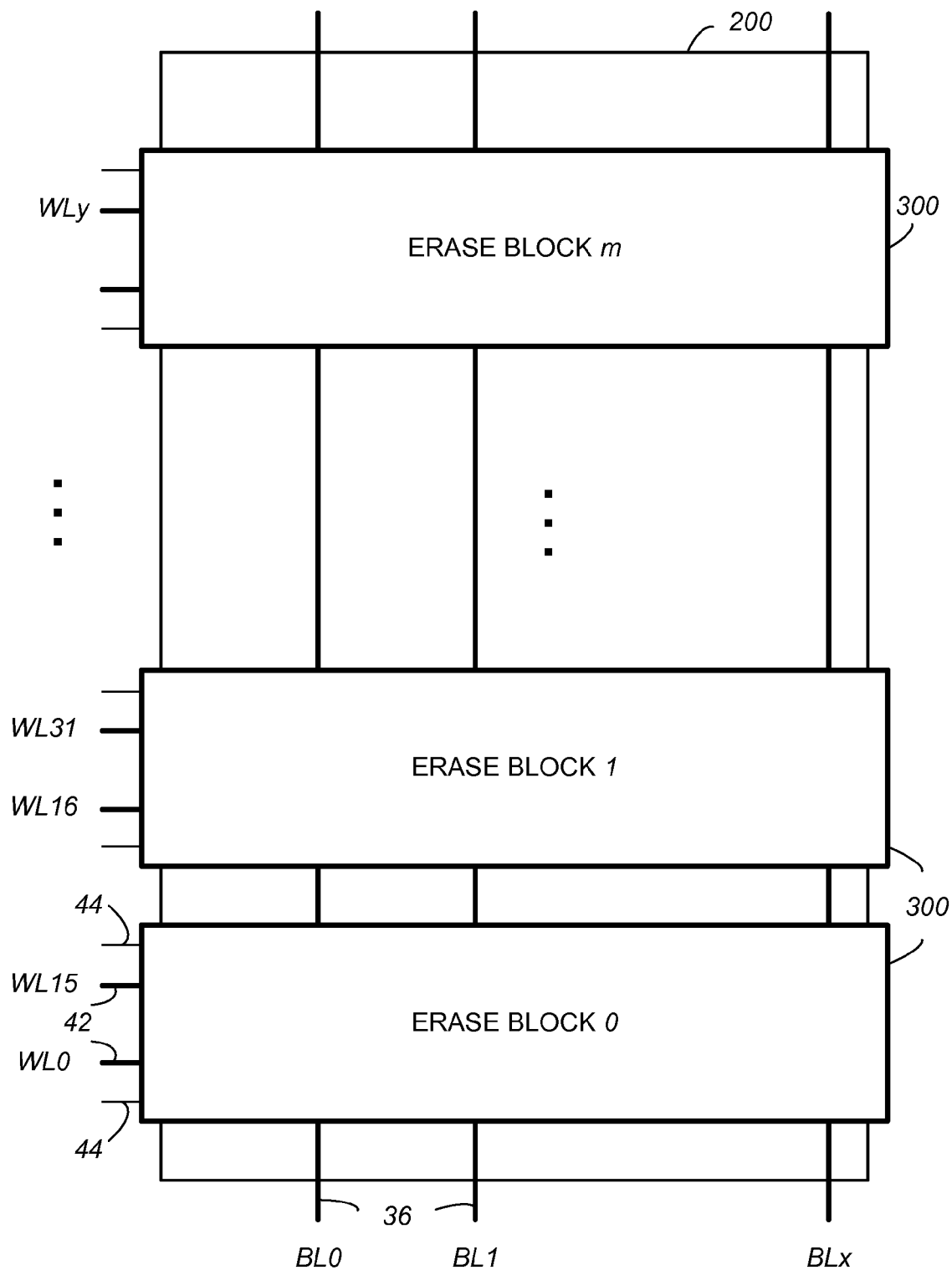
FIG. 4 illustrates schematically an example of a memory array organized in erasable blocks.

FIG. 4 illustrates schematically an example of a memory array organized in erasable blocks. Programming of charge storage memory devices can only result in adding more charge to its charge storage elements. Therefore, prior to a program operation, existing charge in charge storage element of a memory cell must be removed (or erased). A non-volatile memory such as EEPROM is referred to as a "Flash" EEPROM when an entire array of cells 200, or significant groups of cells of the array, is electrically erased together (i.e., in a flash). Once erased, the group of cells can then be reprogrammed. The group of cells erasable together may consist of one or more addressable erase unit 300. The erase unit or block 300 typically stores one or more pages of data, the page being a minimum unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

In the example shown in FIG. 4, individual memory cells in the memory array 200 are accessible by word lines 42 such as WL0-WLy and bit lines 36 such as BL0-BLx. The memory is organized into erase blocks, such as erase blocks 0, 1, . . . m. If the NAND string 50 (see FIG. 2) contains 16 memory cells, then the first bank of NAND strings in the array will be accessible by select lines 44 and word lines 42 such as WL0 to WL15. The erase block 0 is organized to have all the memory cells of the first bank of NAND strings erased together. In memory architecture, more than one bank of NAND strings may be erased together.

Single-Level (SLC) and Multi-Level (MLC) Memory Cells

As described earlier, an example of nonvolatile memory is formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. In SLC memory, each memory cell stores one bit of data. In MLC memory, each memory cell stores more than one bit of data.

Randomization of Data Pattern to Minimize Program Disturb

Data scrambling is used to randomize data in order to avoid data dependency. The intended data is scrambled through a key in the controller 102 (see FIG. 1) before sending to the NAND flash 200. When data is read back, it is then descrambled with the same key. To map the correct key, controller could either use the physical address of the data, or the logical address of the data.

Figures 5, 6, 7:
FIG. 5 illustrates a table storing scrambling key value for every key number.
FIG. 6 illustrates a key selection based on the logical address of the data.
FIG. 7 illustrates a problem with the key selection based on the logical address alone.

FIG. 5 illustrates a key table storing scrambling key value for every key number. For example, the key table 401 is stored in a system portion of the memory array. In operation, it is retrieved into a register as an ordered sequence of key values $(KV_i)$ with each position in the sequence being labeled by a key number $(K_i)$. In one embodiment, each key value may be as simple as "0" or "1". If there are L keys, then they are stored in order in the register and the position in the register could be regarded as the key number. Generally, a unit of data is scrambled and unscrambled as follows:

ScrambledData=$T$(KeyValue)UnscrambleData, where
$T$ is the transform function dependent on the key
value.

UnsrambledData=$T^{-1}$(KeyValue)ScrambledData,
where $T^{-1}$ is the inverse transform.

In one embodiment, the transform function can be as simple as inverting or not inverting the bits in the unit of data depending on the key value being "0" or "1".

Physical address mapping is straightforward, using the physical location within a block to determine the key to be used. However, a general application of this approach has limitations, as for example, when one wishes to move data from one physical location (word line) of the block to a different physical location of another block. Since the location is different, data will have to be read out to the controller, descrambled, and then scrambled with a new key depending on the new physical address and finally toggled back to the memory. This approach is more time consuming since it requires multiple data toggling operations between the memory chip and the controller.

Logical address mapping is more flexible since the same key will always be used for each logically addressed data. This allows the data to travel freely from one block to another block without having to change the corresponding key. However, if the same logical address is updated repeatedly with the same data, such mechanism will be defeated.

FIG. 6 illustrates a key selection based on the logical address of the data. If there are L key values in a key list, and L=32 in this example, then starting from the first logical address, a different key will be assigned from the key list to the each logical address until all L keys are used up. Then the next logical address will start again from the first key in the key list.

Logical address is used for the mapping of scrambling key. The scrambling is done before data gets transferred to the NAND memory, and the same key is used to descramble the data. In this scheme, the key $K_i$=$K_i$(LogicalAddr).

This scheme works if the logical address of each data write is different. However, having the key being a function of the logical address alone may not randomize some data patterns. There are two problems with using just the logical address to select the scrambling key. First, as can be seen in FIG. 6, a short key list will result in a short periodicity. Secondly, multiple updates corresponding to the same logical address will have the same scrambling key and if the updates are the same, so will the data and an undesirable, regular pattern will result.

FIG. 7 illustrates a problem with the key selection based on the logical address alone. If the data associated with the same logical address is being repeatedly updated, each update will being using the same key. Furthermore, if the update data are all the same, the scramble data will also be all the same, thereby resulting in an undesirable regular pattern across the rows of the memory array. To avoid this possibility, one can put a restriction on updating the same logical address in the same block, but such limitation leads to additional garbage collection, resulting in poorer performance and additional wear on the memory cells.

Thus, as described above, selecting a key based on logical address alone has its shortcomings.

Scrambling Data According to Both Logical and Local Physical Addresses

According to a general aspect of the invention, a memory device cooperating with a memory controller scrambles each unit of data using a selected scrambling key before storing it in an array of nonvolatile memory cells. For a given page of data having a logical address and for storing at a physical address, the key is selected from a finite sequence thereof as a function of both the logical address and a localized physical address.

In particular, where the memory has a block management scheme, the memory array is organized into erase blocks, and when logical address are grouped into logical groups and manipulated as a group and each group is storable into a sub-block, the physical address is the relative page number in the sub-block. In this way, when a logical group is relocated to another memory location, the copying is done on the group boundary (i.e., sub-block by sub-block). The logical group can be copied to the new location in its scrambled state. When reading back the logical group at the new location, the same scrambling key can be used to perform the unscrambling because, the logical address of each page in the group has not changed, nor has its localized physical address.

Figure 8:
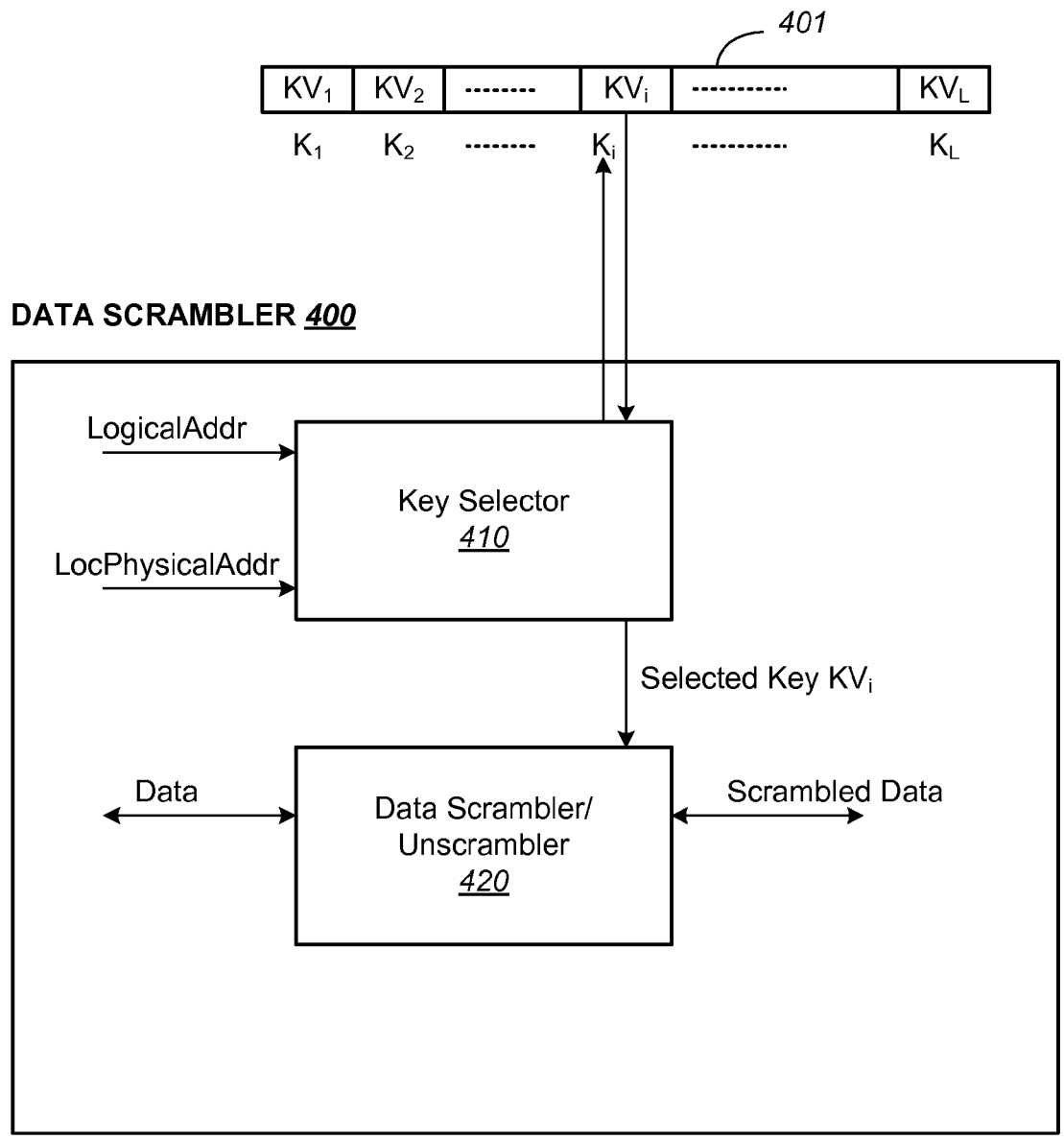
FIG. 8 illustrates is a function block diagram of the data scrambler shown in FIG. 1.

FIG. 8 illustrates is a function block diagram of the data scrambler shown in FIG. 1. The data scrambler 400 is typically implemented in the memory controller 102 because of its processing facilities. The data scrambler 400 includes a key selector 410 which selects a key out of the key table 401 (see FIG. 5) based on the data unit's logical address (LogicalAddr) and localized physical address (LocalPhysicalAddr). A data scrambler/unscrambler 420 then uses the selected key to scramble or unscramble the data.

For example, in the case of a host write, the incoming data is scrambled using the selected key into scrambled data which is then stored by being programmed into the memory array at the localized physical address. In the case of a memory read, the read data, which was stored as scrambled data is unscrambled by the data scrambler/unscrambler 420 using the selected key. In one embodiment, the selected key value is a binary number and the scrambler/unscramble 420 treats the selected key value as a polarity bit and either invert or not invert the unit of data depending on the key's bit value.

The data is typically operated in unit of a page of data and the logical address is typically a logical sector address assigned by a host. In a multi-sector page, it could be the logical address of the first sector of the page. The localized physical address is typically the row number within a block such as the erase block 300 shown in FIG. 4. Alternatively, the localized physical address is the page number within a block. As will be described later, in an embodiment where the data are organized into logical groups, where data of more than on logical groups can be accommodated in a block, the localized physical address is the row or page number within a physical group or sub-block in the block accommodating the logical group.

In a general embodiment, the key is generally given by:

$$K_i = K_i(LogicalAddr, LocalPhyiscalAddr).$$

In one embodiment, for a given logical address, the scrambling key is first determined by the logical address, then it is further determined by the localized physical location. Thus, it may be considered as a two-step function. In the first step, the key is selected based on the logical address. In the second step the key is further modified based on the localized physical address.

Thus, even when there are a limited number L of keys, for example, L=32, the key selection based on the logical address is further randomized by selection based on the localized physical address. In this embodiment, the localized physical address is typically a page offset number in a block, which in many architecture is also the row number in a block. The block is an erase block 300 shown in FIG. 4 with as many as 64 or more rows. The scrambling by localized physical address has a periodicity of N. In one embodiment, N may be as large as the maximum page numbers Nmax in the block. Thus, after N pages, the selection repeats itself again. In other words, the key number would be a function of (page # mod Nmax).

Figure 9:
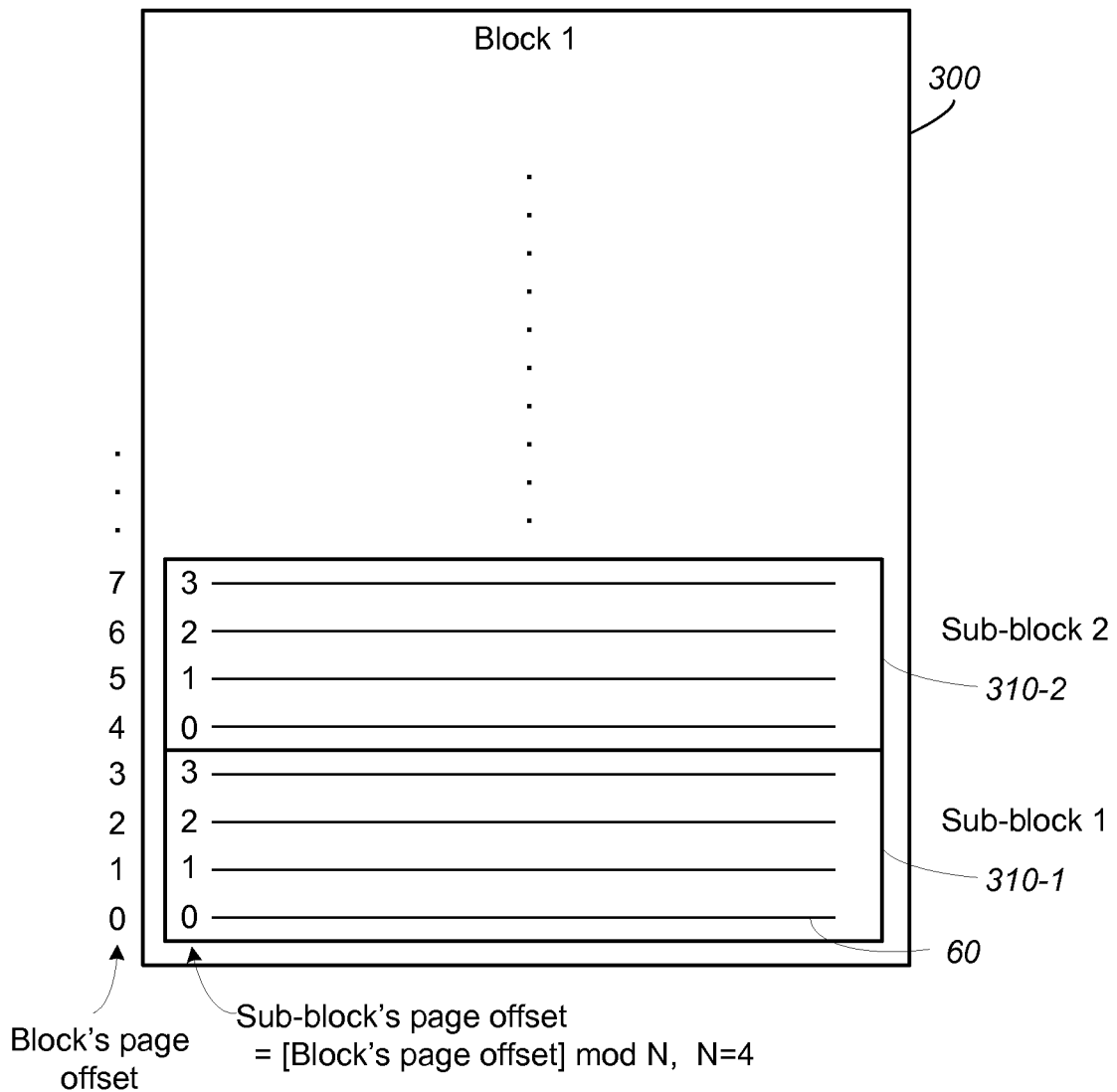
FIG. 9 illustrates an erase block being organized into multiple sub-blocks according to another embodiment of the invention.

FIG. 9 illustrates an erase block being organized into multiple sub-blocks according to another embodiment of the invention. In this embodiment, N may be smaller than the maximum page number Nmax in the block. This is applicable to a block management system in which the logical address assigned by a host are organized into a plurality of logical groups, and each block accommodates multiple sub-blocks each accommodating one logical group of data. For example, if the maximum number of pages in a block is Nmax=64, and the block can accommodate data up to 16 logical groups, then each logical groups has 4 pages and N=4, and each subgroup has 4 pages.

Thus, the erase block 300 contains a plurality of pages 60, each page accessible by a word line. The localized physical address for the block is the block's page offset number. Starting from one end of the block (in this example, the bottom end) the first page has a page offset number of "0", the next page has "1", and each next one has the page offset number incremented by one until Nmax at the end of the block is reached. The block 300 is organized into multiple sub-blocks 310. In this example, each sub-block accommodates 4 pages. The localized physical address in this case is the page offset number in a sub-block 310. This can be obtained from the block's page offset number as:

Sub-block's page offset number=[Block's page offset number] mod N, where N=4 in this example.

Figure 10:
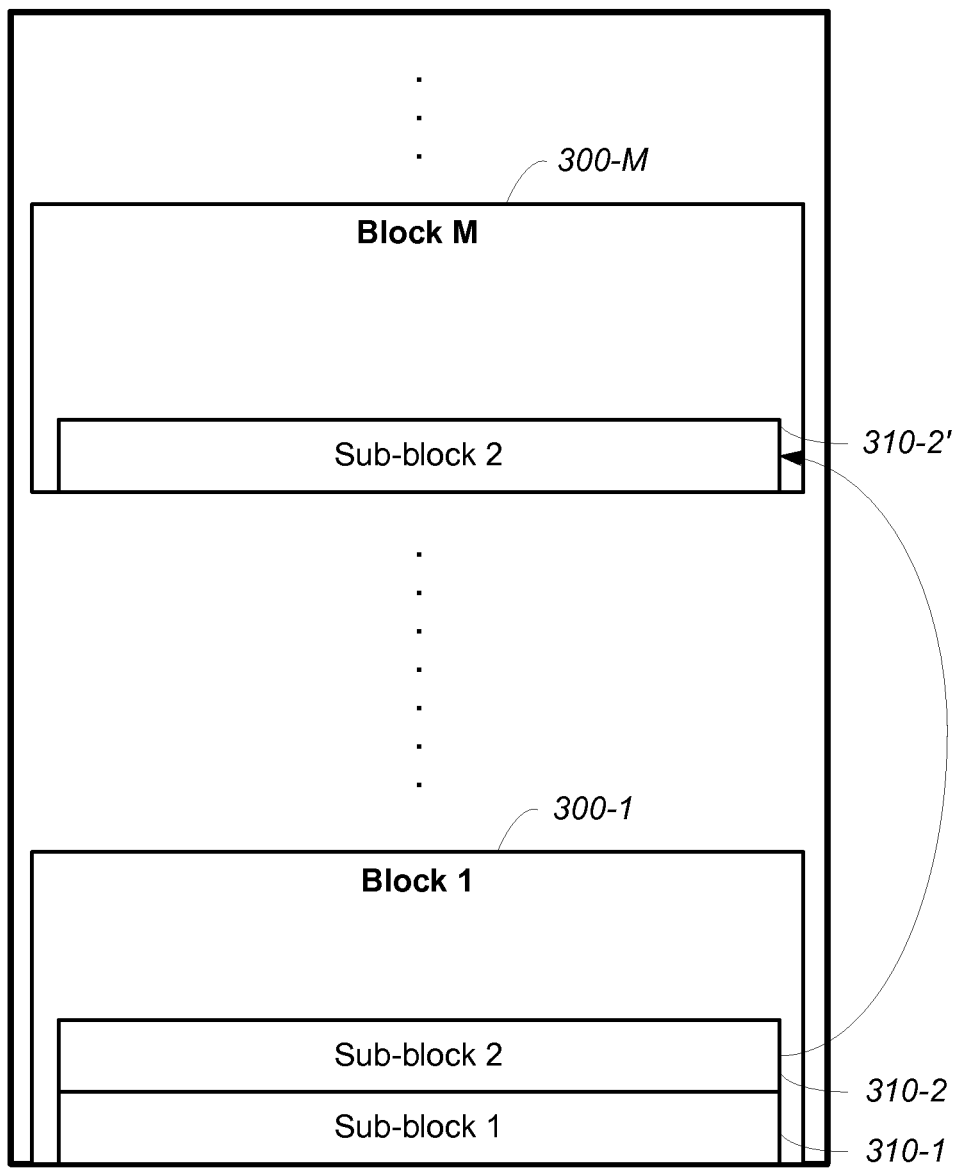
FIG. 10 illustrates the relocation of a sub-block from a first block to a second block.

FIG. 10 illustrates the relocation of a sub-block from a first block to a second block. In this example, sub-block 310-2 is relocated from block 300-1 to become sub-block 301-2' in block 300-M. Since the physical address is the relative physical address of a sub-block, it does not change in the relocation and the key for each page in the sub-block will remain the same.

FIG. 11 illustrates the example of data pattern shown in FIG. 7 but with the scrambling key depending on only the localized physical address. In this example, the logical address is constant, implying that data of the same logical address is repeatedly being updated as in the scenario illustrated in FIG. 7. For example if the size of the physical group corresponding to the logical group is N=4 pages, and the localized physical address is LocalPhysicalAddr, then the selection of key K:

$$K_i = K_i(PageOffsetAddr \bmod N)$$
$$= LocalPhysicalAddr.$$

Thus, if the data is stored in the physical block page by page, each page is scrambled with one of 4 keys. It will be seen that unlike that of FIG. 7, repeated pattern will now be randomized. While this method alone with take care of repeated pattern like that illustrated in FIG. 7, but keeping the group size N small will also limit the number of possible keys (e.g., only 4 keys in FIG. 11.

FIG. 12 illustrates a preferred data pattern scrambling with a scrambling key being a function of both the logical address and localized physical address. For example if the size of the key list=L, the size of the physical address group=N, then one function is given as:

$$K_i = K_i(LogicalAddr, LocalPhysicalAddr)$$
$$= [(logicalAddr \bmod L) +$$
$$(LocalPhysicalAddr \bmod N)) \bmod L]$$

With the example L=32 and N=4, logical address=100, and at page# the key is:

$$K_i = [100 \bmod 32 + page\# \bmod 4] \bmod 32$$
$$= [4 + 0] \bmod 32$$
$$= 4$$

Similarly, for the data stored in page #1:

$$K_i = [8 + 1 \bmod 4] \bmod 32$$
$$= 9$$

When the two methods of logical address and localized physical address mapping are combined, the number of keys is not limited to the logical group size N (e.g., 4) but is now drawn from the pool of key of size L (e.g., 32). The repeated pattern is no long an issue. Relocation of data can still be done from one physical location to another in the memory array since the copy is done on the group boundary (in this case defined by a sub-block having N=4 pages), thus scrambling key used is still the same regardless of where the other group is located physically in the memory array.

Scrambling Data by Pseudorandom Inversion

According to another aspect of the invention, the scrambling data is a function of inversion or not inversion of data. The decision to invert data or not could be simply based on the physical address to provide a pseudorandom pattern, or it could be based on device physics analysis that tailor the algorithm to combat the worst data dependency pattern. In the first case, it is a simple function of the physical address. In the latter case, it could be a more involved function of the physical address. In this scheme, scrambled data is generally given by:

ScrambledData=Invert(UnscrambledData,PhysicalAddr).

NAND memory uses data latches to store data temporarily, and does logical manipulation to the data during normal program or read command. One such manipulation is inversion. This invention utilizes the native inversion function on the memory data latch, to randomize the data based on physical address. FIG. 3 illustrates that the data latches 220 can be manipulated by the common processor 250. One such on-chip manipulation is the inversion of the data bits in the data latches.

FIG. 13 illustrates an example of inverting being based on the physical address the data every 2 word lines. In this case, inversion is based on the word line number. For SLC pages, each word line has one page, so every other two SLC pages, the data is inverted. In the case of a 2-bit MLC memory, there will be a lower and upper page per word line. So, in the case of an MLC memory, every 4 pages will be inverted. In any case, it will be seen that the pattern repeats itself every two word lines.

According to another embodiment, to increase the randomness of data, the data may also be inverted at the page level at predefined page numbers.

FIG. 14 illustrates an example of selectively inverting at the page level. For example, in the same case where data is inverted every two word lines and 4 MLC pages, we could permutation the inversion within each group of 4 pages and change the inversion decision to 2**4=32 different combinations.

The controller will issue command to invert data in the data latches before programming is done, and also invert the data back before data is read back. This is done internally to the memory, and thus data need not be toggled out if such data is to be moved to a different block. Alternatively, the inversion can be done internally without the controller's knowledge if the desired pattern is known.

The method of generating the scrambling key as a function of localized physical address also allows fast on-chip copy of data from one physical location to another physical without having to toggle the data out to the controller to do the scrambling. Scrambling can be simply done on chip given that the minimum copy size is the size of the group. This is achieved due to the alignment of scrambling key along the group boundary.

According to yet another embodiment, data is scrambled by a combination of all three scrambling schemes described above, namely, scrambling the data with a scrambling key dependent on the logical address and physical address individually or in combination and then invert the data as a function of either the physical address or logical address.

FIG. 15 illustrates a table similar to that shown in FIG. 12 in which the data is scrambled by a key dependent on both the logical and localized physical addresses. Furthermore, it has an additional column showing the scrambled data to be inverted or not inverted.

The combination of logical/physical mapping, and physical inversion based on memory word line location will ensure no repeated pattern that may cause data dependency program disturb. This does not sacrifice performance, has not limitation, and does not require additional gates.

The various mappings described above can be performed at the controller 102 or on-chip or by a combination of the two.

No added cost to the overall system since scrambler is already part of the ASIC and data inversion is already part of memory logic.

Compared to using just physical address, this invention will eliminate the need to toggle data, therefore improve overall performance Using it in conjunction with logical mapping also improves the randomness of data.

Compared to using just logical address, this invention will allow the same logical address to be written repeatedly on the same block, therefore decreasing the frequency to garbage collect. It also solves the repeated pattern problem.

While the embodiments of this invention that have been described are the preferred implementations, those skilled in the art will understand that variations thereof may also be possible. Therefore, the invention is entitled to protection within the full scope of the appended claims.

It is claimed:

1. A memory, comprising:
   an array of nonvolatile memory cells accessible page by page;

each page being a group of data with a logical address and for storing in the array at a physical address;
said array of nonvolatile memory cells are organized into a plurality of blocks, each block having memory cells that are erasable together;
each block further partitioned into a plurality of sub-blocks, each sub-block for accommodating data corresponding to a logical group of logical addresses;
a sequence of scrambling keys;
a key selector for selecting a key for scrambling a page of data, said key selector selecting the key from said sequence of scrambling keys as a function of the logical address and the physical address;
said physical address is a relative page address in a sub-block; and
a data scrambler/unscrambler for scrambling the page of data when it is unscrambled as a function of the selected key or for unscrambling the page of data when it is scrambled as a function of the selected key; and wherein:
said sequence of scrambling keys has a length L;
said physical address is one of a sequence of such physical addresses, the sequence having a length N; and
said function of the logical address and the physical address of the page of data depends on (logical address) mod L and (physical address) mod N.

2. The memory as in claim 1, further comprising:
a memory controller controlling memory operations of said array of nonvolatile memory cells; and
wherein said key selector and said data scrambler/unscrambler are implemented in said memory controller.

3. The memory as in claim 1, further comprising:
read/write circuits; and
said read/write circuits programming the current page of data after it is scrambled into said array of memory cells at the physical address.

4. The memory as in claim 1, further comprising:
read/write circuits; and
said read/write circuits reading the current page of data stored as scrambled data from said array of memory cells at the physical address.

5. The memory as in claim 1, wherein:
said array of nonvolatile memory cells are organized into a plurality of blocks, each block having memory cells that are erasable together, and
said physical address is a relative page address in a block.

6. The memory as in claim 1, wherein:
said array of nonvolatile memory cells are organized into a plurality of blocks, each block having memory cells that are erasable together; and
said physical address is a relative row address in a block.

7. A memory, comprising:
an array of nonvolatile memory cells accessible page by page;
each page being a group of data with a logical address and for storing in the array at a physical address;
said array of nonvolatile memory cells are organized into a plurality of blocks, each block having memory cells that are erasable together;
each block further partitioned into a plurality of sub-blocks, each sub-block for accommodating data corresponding to a logical group of logical addresses;
a sequence of scrambling keys;
a key selector for selecting a key for scrambling a page of data, said key selector selecting the key from said sequence of scrambling keys as a function of the logical address and the physical address;
said physical address is a relative page address in a sub-block; and
a data scrambler/unscrambler for scrambling the page of data when it is unscrambled as a function of the selected key or for unscrambling the page of data when it is scrambled as a function of the selected key; and wherein:
said sequence of scrambling keys has a length L;
said physical address is one of a sequence of such physical addresses, the sequence having a length N; and
said function of the logical address and the physical address of the page of data depends on [(logical address) mod L+(physical address) mod N] mod L.

8. The memory as in claim 7, further comprising:
a memory controller controlling memory operations of said array of nonvolatile memory cells; and
wherein said key selector and said data scrambler/unscrambler are implemented in said memory controller.

9. The memory as in claim 7, wherein:
said array of nonvolatile memory cells are organized into a plurality of blocks, each block having memory cells that are erasable together; and
said physical address is a relative page address in a block.

10. The memory as in claim 7, wherein:
said array of nonvolatile memory cells are organized into a plurality of blocks, each block having memory cells that are erasable together; and
said physical address is a relative row address in a block.

11. A memory, comprising:
an array of nonvolatile memory cells accessible page by page;
each page being a group of data with a logical address and for storing in the array at a physical address;
said array of nonvolatile memory cells are organized into a plurality of blocks, each block having memory cells that are erasable together;
each block further partitioned into a plurality of sub-blocks, each sub-block for accommodating data corresponding to a logical group of logical addresses;
a sequence of scrambling keys;
a key selector for selecting a key for scrambling a page of data, said key selector selecting the key from said sequence of scrambling keys as a function of the logical address and the physical address;
said physical address is a relative page address in a sub-block; and
a data scrambler/unscrambler for scrambling the page of data when it is unscrambled as a function of the selected key or for unscrambling the page of data when it is scrambled as a function of the selected key; and wherein:
said physical address is one of a sequence of such physical addresses, the sequence having a length N; and
said function of the logical address and the physical address of the page of data depends on inverting or not inverting based on the physical address.

12. The memory as in claim 11, further comprising:
a memory controller controlling memory operations of said array of nonvolatile memory cells; and
wherein said key selector and said data scrambler/unscrambler are implemented in said memory controller.

13. The memory as in claim 11, wherein:
said array of nonvolatile memory cells are organized into a plurality of blocks, each block having memory cells that are erasable together; and
said physical address is a relative page address in a block.

14. The memory as in claim 11, wherein:
said array of nonvolatile memory cells are organized into a plurality of blocks, each block having memory cells that are erasable together; and
said physical address is a relative row address in a block.

15. A method of scrambling or unscrambling a page of data in a non-volatile memory, comprising:
providing an array of nonvolatile memory cells accessible page by page;
each page being a group of data with a logical address and for storing in the array at a physical address:
said array of nonvolatile memory cells are organized into a plurality of blocks, each block having memory cells that are erasable together;
each block further partitioned into a plurality of sub-blocks, each sub-block for accommodating data corresponding to a logical group of logical addresses;
providing a sequence of scrambling keys;
selecting a key for scrambling the page of data, the key being selected from said sequence of scrambling keys as a function of the logical address and the physical address of the page of data;
said physical address is a relative page address in a sub-block; and
scrambling the page of data when it is unscrambled as a function of the selected key or unscrambling the page of data when it is scrambled as a function of the selected key, wherein:
said physical address is one of a sequence of such physical addresses, the sequence having a length N; and
said function of the logical address and the physical address of the page of data depends on inverting or not inverting based on the physical address.

16. The method as in claim 15, further comprising:
providing a memory controller controlling memory operations of said array of nonvolatile memory cells including said selecting a key and said scrambling or unscrambling the page of data.

17. The method as in claim 15, further comprising:
programming the current page of data after it is scrambled into said array of memory cells at the physical address.

18. The method as in claim 15, further comprising:
reading the current page of data stored as scrambled data from said array of memory cells at the physical address.

19. The method as in claim 15, wherein:
said array of nonvolatile memory cells are organized into a plurality of blocks, each block having memory cells that are erasable together, and
said physical address is a relative page address in a block.

20. The method as in claim 15, wherein:
said array of nonvolatile memory cells are organized into a plurality of blocks, each block having memory cells that are erasable together; and
said physical address is a relative row address in a block.

* * * * *